(12) United States Patent
Kellogg et al.

(10) Patent No.: US 8,987,678 B2
(45) Date of Patent: Mar. 24, 2015

(54) ENCAPSULATION OF ELECTRODES IN SOLID MEDIA

(75) Inventors: Sean Kellogg, Portland, OR (US); N. William Parker, Hillsboro, OR (US); Mark W. Utlaut, Scappoose, OR (US); Anthony Graupera, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 81 days.

(21) Appl. No.: 13/437,599

(22) Filed: Apr. 2, 2012

(65) Prior Publication Data

US 2012/0261587 A1 Oct. 18, 2012

Related U.S. Application Data

(63) Continuation-in-part of application No. 13/165,556, filed on Jun. 21, 2011, now Pat. No. 8,642,974, and a continuation-in-part of application No. 13/353,032, filed on Jan. 18, 2012, which is a continuation of application No. 13/182,925, filed on Jul. 14, 2011, now abandoned, which is a continuation of application No. 12/982,606, filed on Dec. 30, 2010, now abandoned.

(60) Provisional application No. 61/291,288, filed on Dec. 30, 2009.

(51) Int. Cl.

| | |
|---|---|
| G21K 1/08 | (2006.01) |
| H01J 27/16 | (2006.01) |
| H01J 37/08 | (2006.01) |
| H01J 37/32 | (2006.01) |
| H05H 1/28 | (2006.01) |
| H05H 1/30 | (2006.01) |
| H05H 1/46 | (2006.01) |

(52) U.S. Cl.
CPC ............... *H01J 27/16* (2013.01); *H01J 37/08* (2013.01); *H01J 37/321* (2013.01); *H05H 1/28* (2013.01); *H05H 1/30* (2013.01); *H05H 1/46* (2013.01); *H01J 2237/002* (2013.01); *H01J 2237/061* (2013.01); *H01J 2237/0817* (2013.01); *H01J 2237/31749* (2013.01); *H05H 2001/4652* (2013.01); *H05H 2001/4682* (2013.01)
USPC .................................. 250/396 R; 250/423 R

(58) Field of Classification Search
None
See application file for complete search history.

(56) References Cited

U.S. PATENT DOCUMENTS 3,860,345 A * 1/1975 Raillere et al. ................ 356/315
4,362,632 A 12/1982 Jacob (Continued)

FOREIGN PATENT DOCUMENTS

| JP | 64-014849 | 1/1989 |
|---|---|---|
| JP | 3272549 | 12/1991 |

(Continued)

OTHER PUBLICATIONS

Coath, C.D. et al., "A high-brightness duoplasmatron ion source for microprobe secondary-ion mass spectrometry," Rev. Sci. Instrum., Feb. 1995, pp. 1018-1023, vol. 66 (2).

(Continued)

*Primary Examiner* — Andrew Smyth
(74) *Attorney, Agent, or Firm* — Scheinberg & Associates, PC; Michael O. Scheinberg

(57) ABSTRACT

An inductively-coupled plasma source for a focused charged particle beam system includes a conductive shield that provides improved electrical isolation and reduced capacitive RF coupling and a dielectric fluid that insulates and cools the plasma chamber. The conductive shield may be enclosed in a solid dielectric media. The dielectric fluid may be circulated by a pump or not circulated by a pump. A heat tube can be used to cool the dielectric fluid.

25 Claims, 10 Drawing Sheets

(56) References Cited

U.S. PATENT DOCUMENTS

| | | | |
|---|---|---|---|
| 4,503,329 A | 3/1985 | Yamaguchi et al. | |
| 4,659,899 A | 4/1987 | Welkie et al. | |
| 4,856,457 A | 8/1989 | Knauer | |
| 4,859,908 A | 8/1989 | Yoshida et al. | |
| 4,870,284 A | 9/1989 | Hashimoto et al. | |
| 4,886,969 A | 12/1989 | Knauer | |
| 4,935,623 A | 6/1990 | Knauer | |
| 5,008,537 A | 4/1991 | Toita et al. | |
| 5,019,712 A | 5/1991 | Knauer | |
| 5,036,252 A * | 7/1991 | Lob | 315/111.31 |
| 5,108,535 A | 4/1992 | Ono et al. | |
| 5,188,705 A | 2/1993 | Swanson et al. | |
| 5,237,175 A * | 8/1993 | Wells | 250/288 |
| 5,270,552 A | 12/1993 | Ohnishi et al. | |
| 5,435,850 A | 7/1995 | Rasmussen | |
| 5,573,595 A | 11/1996 | Dible | |
| 5,614,711 A | 3/1997 | Li et al. | |
| 5,622,635 A * | 4/1997 | Cuomo et al. | 216/68 |
| 5,681,418 A | 10/1997 | Ishimaru | |
| 5,686,796 A | 11/1997 | Boswell et al. | |
| 5,825,035 A | 10/1998 | Mizumura et al. | |
| 5,827,786 A | 10/1998 | Puretz | |
| 5,850,083 A | 12/1998 | Koikari et al. | |
| 5,851,413 A | 12/1998 | Casella et al. | |
| 5,945,677 A | 8/1999 | Leung et al. | |
| 6,017,221 A | 1/2000 | Flamm | |
| 6,127,275 A | 10/2000 | Flamm | |
| 6,180,019 B1 * | 1/2001 | Kazumi et al. | 216/78 |
| 6,228,176 B1 | 5/2001 | Chu et al. | |
| 6,239,404 B1 | 5/2001 | Lea et al. | |
| 6,385,977 B1 | 5/2002 | Johnson | |
| 6,425,953 B1 | 7/2002 | Johnson | |
| 6,447,636 B1 | 9/2002 | Qian et al. | |
| 6,459,066 B1 | 10/2002 | Khater et al. | |
| 6,491,742 B1 | 12/2002 | Johnson | |
| 6,545,420 B1 * | 4/2003 | Collins et al. | 315/111.51 |
| 6,554,953 B2 * | 4/2003 | Daviet | 156/345.48 |
| 6,639,226 B2 | 10/2003 | Morio et al. | |
| 6,664,552 B2 | 12/2003 | Shichi et al. | |
| 6,743,481 B2 | 6/2004 | Hoehn et al. | |
| 6,753,538 B2 | 6/2004 | Da et al. | |
| 6,758,948 B2 * | 7/2004 | Johnson | 204/192.12 |
| 6,768,120 B2 | 7/2004 | Leung et al. | |
| 6,770,836 B2 | 8/2004 | Kwon et al. | |
| 6,806,650 B2 | 10/2004 | Johnson et al. | |
| 6,833,051 B2 * | 12/2004 | Kazumi et al. | 156/345.48 |
| 6,897,157 B2 | 5/2005 | Liang et al. | |
| 6,926,935 B2 | 8/2005 | Arjavac et al. | |
| 6,946,063 B1 * | 9/2005 | Gonzalez et al. | 204/298.06 |
| 6,975,072 B2 | 12/2005 | Leung et al. | |
| 7,084,407 B2 | 8/2006 | Ji et al. | |
| 7,176,469 B2 | 2/2007 | Leung et al. | |
| 7,220,963 B2 | 5/2007 | Gross | |
| 7,241,361 B2 | 7/2007 | Keller et al. | |
| 7,298,091 B2 | 11/2007 | Pickard et al. | |
| 7,442,942 B2 | 10/2008 | Takahashi et al. | |
| 7,629,590 B2 | 12/2009 | Horsky et al. | |
| 7,691,243 B2 | 4/2010 | Vukovic | |
| 8,253,118 B2 * | 8/2012 | Zhang et al. | 250/492.21 |
| 2001/0009353 A1 | 7/2001 | Patterson et al. | |
| 2002/0023899 A1 * | 2/2002 | Khater et al. | 219/121.41 |
| 2003/0024900 A1 | 2/2003 | Johnson | |
| 2003/0062840 A1 | 4/2003 | Moroz | |
| 2003/0168588 A1 | 9/2003 | Brailove et al. | |
| 2004/0036032 A1 | 2/2004 | Leung et al. | |
| 2004/0140054 A1 | 7/2004 | Johnson | |
| 2004/0262237 A1 | 12/2004 | Kornbrekke et al. | |
| 2005/0019209 A1 * | 1/2005 | Burger et al. | 422/23 |
| 2005/0145341 A1 * | 7/2005 | Suzuki | 156/345.49 |
| 2005/0183667 A1 * | 8/2005 | Keller et al. | 118/723.001 |
| 2006/0045987 A1 | 3/2006 | Chandler et al. | |
| 2006/0060566 A1 | 3/2006 | Puech | |
| 2006/0272775 A1 | 12/2006 | Horsky et al. | |
| 2007/0034154 A1 | 2/2007 | Fink | |
| 2008/0142735 A1 | 6/2008 | Chandler et al. | |
| 2008/0220596 A1 | 9/2008 | Olander et al. | |
| 2008/0314871 A1 | 12/2008 | Toth et al. | |
| 2009/0008239 A1 | 1/2009 | Sorensen et al. | |
| 2009/0273912 A1 * | 11/2009 | Myers et al. | 361/818 |
| 2009/0309018 A1 | 12/2009 | Smith et al. | |
| 2010/0044580 A1 | 2/2010 | Boswell et al. | |
| 2010/0126964 A1 * | 5/2010 | Smith et al. | 216/68 |
| 2010/0243889 A1 | 9/2010 | Faber et al. | |
| 2010/0301211 A1 | 12/2010 | Miller | |
| 2011/0049382 A1 | 3/2011 | Miller et al. | |
| 2011/0084207 A1 | 4/2011 | Zhang et al. | |

FOREIGN PATENT DOCUMENTS

| | | |
|---|---|---|
| JP | 6176725 | 6/1994 |
| JP | 7312201 | 11/1995 |
| JP | 07-335163 | 12/1995 |
| JP | 2009-140762 | 6/2009 |
| WO | 2005038821 | 4/2005 |
| WO | 2007149727 | 12/2007 |
| WO | 2008094297 | 8/2008 |
| WO | 2009148648 | 12/2009 |

OTHER PUBLICATIONS

Coupland, J.R. et al., "A Study of the Ion Beam Intensity and Divergence Obtained from a Single Aperture Three Electrode Extraction System," Rev. Sci. Instrum., Sep. 1973, pp. 1258-1270, vol. 44, No. 9.

Daykin, P.N., "Electrode shapes for a cylindrical electron beam," British Journal of Applied Physics, Dec. 22, 1955, pp. 248-250.

Han, B.X., et al., "Evaluation and utilization of beam simulation codes for the SNS ion source and low energy beam transport development," Review of Scientific Instruments, 2008, 6 pages, vol. 79.

Harrison, E.R., "Approximate electrode shapes for a cylindrical electron beam," British Journal of Applied Physics, Mar. 6, 1953, pp. 40-41.

Henderson, S., et al., "Status of the SNS Beam Power Upgrade Project*," Proceedings of EPAC, Jun. 2006, pp. 345-347.

Hopwood, J., "A Microfabricated Inductively-Coupled Plasma Generator," Journal of Microelectromechanical Systems, Sep. 2000, pp. 309-313, vol. 9, Issue 3.

Jiang, X. et al., "Mini rf-driven ion sources for focused ion beam systems," Review of Scientific Instruments, Apr. 2003, pp. 2288-2292, vol. 74, No. 4.

Ji, Qing et al., "Development of focused ion beam systems with various ion species," Nuclear Instruments and Methods in Physics Research B: Beam Interactions with Materials & Atoms, 2005, pp. 335-340, vol. 241.

Leung, K., "Radio-Frequency Driven Sources," The Physics and Technology of Ion Sources, 2nd Edition, Ian G. Brown (Ed.), Nov. 2004, pp. 163-175, Wiley-VCH, Weinheim, Germany.

Mordyk, Serhiy et al., "High-plasma-density helicon source for ion beam application," 13th International Congress on Plasma Physics, May 22-26, 2006, 4 pages, Kiev, Ukraine.

Mukherjee, S.K. et al., "Mechanical Design of the Prototype H Ion Source for the Spallation Neutron Source," Proceedings of the 1999 Particle Accelerator Conference, New York, 1999, pp. 1914-1916.

Nabhiraj, P.Y. et al., "Design of High Current RF Ion Source for Micromachining Applications," APAC 2007, Raja Ramanna Centre for Advanced Technology (RRCAT), Indore, India, pp. 262-264.

Okada, Katsuyuki et al., "Diagnostics of Low Pressure Inductively Coupled VHF Plasma Used for Nanostructured Carbon Deposition," 28th International Conference of Phenomena in Ionized Gases, Jul. 15-20, 2007, 2 pages, Prague, Czech Republic.

"Plasma Controller, Oxford Scientific 'OSPreyRF'," Oxford Scientific Instruments for Innovators, accessed Apr. 4, 2011, 1 page.

Panagopoulos, Theodoros et al., "Plasma sheath model and ion energy distribution for all radio frequencies," Journal of Applied Physics, Apr. 1, 1999, pp. 3435-3443, vol. 85, No. 7.

Welton, R.F. et al., "RF-Plasma Coupling Schemes for the SNS Ion Source," Radio Frequency Power in Plasmas: 15th Topical Conference on Radio Frequency Power in Plasmas. AIP Conference Proceedings, 2003, pp. 431-438, vol. 694.

(56) References Cited

OTHER PUBLICATIONS

Welton, R.F. et al., "The design of high power, external antennas for radio frequency multicusp ion sources," Review of Scientific Instruments, May 2004, pp. 1789-1792, vol. 75, No. 5.
"RFVII Brochure," RFVII Incorporated, accessed Feb. 29, 2008, 10 pages.
Vargas-Aburto, Carlos, et al., "Development of a Quadrupole-Based Secondary-Ion Mass Spectrometry (SIMS) System at Lewis Research Center," Jun. 1990, 36 pages.
Welton, R.F., et al., "Advanced RF-Driven H-Ion Sources at the SNS," Particle Accelerator Conference, Jun. 25-29, 2007, pp. 3774-3776.
Welton, R.F., et al., "Ion source antenna development for the Spallation Neutron Source," Review of Scientific Instruments, Feb. 2002, pp. 1008-1012, vol. 73, No. 2.
Welton, R.F., et al., "The continued development of the Spallation Neutron Source external antenna H-ion source," Review of Scientific Instruments, 2010, 3 pages, vol. 81.
Whitlock, Bill, "Shields, grounds and microphone cables," 2004 Rycote Microphone Windshields Ltd., 6 pages.
Wituschek, H., et al., "Investigation of extraction systems with low aberrations," Rev. Sci. Instrum., Apr. 1992, pp. 2785-2787, vol. 63, No. 4.
Yin, Y., et al., "Miniaturization of Inductively Coupled Plasma Sources," Plasma Science, IEEE Transactions, Oct. 1999, pp. 1516-1524, vol. 27, Issue 5.
Speth, E., et al., "Overview of RF Source Development at IPP," CCNB—Meeting at Padua, Italy, Jun. 5-6, 2006, 29 pages.
Sobolewski, Mark et al., "Ion energy distributions and sheath voltages in a radio-frequency-biased, inductively coupled, high-density plasma reactor," Journal of Applied Physics, Apr. 15, 1999, pp. 3966-3975, vol. 85, No. 8.
Sobolewski, Mark et al., "Measurements and modeling of ion energy distributions in high-density, radio-frequency biased CF4 discharges," Journal of Applied Physics, May 15, 2002, pp. 6303-6314, vol. 91, No. 10.
Wagenaars, Erik, "Plasma Breakdown of Low-Pressure Gas Discharges," Nov. 30, 2006, pp. 6-7, Eindhoven University of Technology, Eindhoven, Netherlands.
Wang, Yicheng et al., "Ion energy distributions in inductively coupled radio-frequency discharges in argon, nitrogen, oxygen, chlorine, and their mixtures," Journal of Applied Physics, May 1, 1999, pp. 6358-6365, vol. 85, No. 9.
Welton, R.F. et al., "Development and Status of the SNS Ion Source," Proceedings of the 2003 Particle Accelerator Conference, 2003, pp. 3306-3308.
Welton, Robert F., "Ion Source R&D at the SNS," Accelerator Physics and Technology Seminar, Fermilab Jan. 19, 2006, 32 pages.
"Xe Sputter Yields," National Physical Laboratory, May 12, 2005, 6 pages.
Smith, N. S., et al., "A High Brightness Source for Nano-Probe Secondary Ion Mass Spectrometry," Applied Surface Science, Dec. 15, 2008, pp. 1606-1609, vol. 255, Issue 4.
Smith, N. S., et al., "High brightness inductively coupled plasma source for high current focused ion beam applications," J. Vac. Sci. Technol. B, Nov./Dec. 2006, pp. 2902-2906, vol. 24(6).
Steffens, P., et al., "A time-of-flight mass spectrometer for static SIMS applications," J. Vac. Sci. Technol. A, May/ Jun. 1985, pp. 1322-1325, vol. 3, Issue 3.
Tesch, Paul, et al., "High Current Focused Ion Beam Instrument for Destructive Physical Analysis Applications," 34th International Symposium for Testing and Failure Analysis, Nov. 2-6, 2008, pp. 7-13, Portland, Oregon.
Keller, R., "Ion Extraction," The Physics and Technology of Ion Sources, The University of California, 1989, pp. 23-50.
Leung, Ka-Ngo, "Plasma sources for electrons and Ion beams," J. Vac. Sci. Technol. B, Nov./Dec. 1999, pp. 2776-2778, vol. 17, Issue 6.
Lieberman, Michael A. et al., "Principles of Plasma Discharges and Materials Processing," 1994, ISBN: 0-471-00577-0, pp. 31-37 and 157-163.
Mathew, Jose V., et al., "Subcutoff microwave driven plasma ion sources for multielemental focused ion beam systems," Review of Scientific Instruments, 2008, 5 pages, vol. 79.
"CeramTec High Voltgae Isolator Catalog," CeramTec North America Corporation, accessed Feb. 29, 2008, 15 pages.
Hahto, S.K. et al., "Multicusp ion source with external rf antenna for production of protons," Review of Scientific Instruments, Feb. 2004, pp. 355-359, vol. 75, No. 2.
Hayes, A.V., et al., "Recent advances in Veeco's radio frequency ion sources for ion beam materials processing applications (abstract)," Review of Scientific Instruments, Feb. 2002, p. 880, vol. 73, No. 2.
"IMG-31 / IGPS-31 Microwave Ion Source / Power Supply," Kimball Physics Inc., accessed Apr. 4, 2011, 2 pages.
Iwai, H., et al., "A Study of Charge Compensation for Insulator Samples in AES by Low Energy Ion Beam Irradiation," Journal of Surface Analysis, 1999, 4 pages, vol. 5, No. 1.

\* cited by examiner

ENCAPSULATION OF ELECTRODES IN SOLID MEDIA

This application is a continuation-in-part of U.S. patent application Ser. No. 13/165,556, filed Jun. 21, 2011, and a continuation-in-part of U.S. patent application Ser. No. 13/353,032, filed Jan. 18, 2012, which is a continuation of U.S. patent application Ser. No. 13/182,925, filed Jul. 14, 2011, which is a continuation of Ser. No. 12/982,606, filed Dec. 30, 2010, which claims priority from U.S. Prov. App. 61/291,288, filed Dec. 30, 2009, all of which are hereby incorporated by reference.

TECHNICAL FIELD OF THE INVENTION

The present invention relates to inductively-coupled plasma ion sources and more specifically to the means of cooling the plasma sources while providing high voltage isolation.

BACKGROUND OF THE INVENTION

Inductively-coupled plasma (ICP) sources have advantages over other types of plasma sources when used with a focusing column to form a focused beam of charged particles, i.e., ions or electrons. The inductively-coupled plasma source is capable of providing charged particles within a narrow energy range, which allows the particles to be focused to a small spot. ICP sources, such as the one described in U.S. Pat. No. 7,241,361, which is assigned to the assignee of the present invention, include a radio frequency (RF) antenna typically wrapped around a ceramic plasma chamber. The RF antenna provides energy to maintain the gas in an ionized state within the chamber.

The energy of ions used for ion beam processes is typically between 5 keV and 50 keV, and most typically about 30 keV. Electron energy varies between about 500 eV to 5 keV for a scanning electron microscope system to several hundred thousand electron volts for a transmission electron microscope system. The sample in a charged particle system is typically maintained at ground potential, with the source maintained at a large electrical potential, either positive or negative, depending on the particles used to form the beam. Thus, the ion beam source is typically maintained at between 5 kV and 50 kV and the electron source is typically maintained at between 500 V and 5 kV. "High voltage" as used herein means positive or negative voltage greater than about 500 V above or below ground potential. For the safety of operating personnel, it is necessary to electrically isolate the high voltage components. The electrical isolation of the high voltage plasma creates several design problems that are difficult to solve in light of other goals for a plasma source design.

One design difficulty occurs because gas must be brought into the high voltage plasma chamber to replenish the gas as ions leave the plasma. The gas is typically stored at ground potential and well above atmospheric pressure. Gas pressure in a plasma chamber typically varies between about $10^{-3}$ mbar and about 1 mbar. The electrical potential of the gas must be brought to that of the high voltage plasma and the pressure of the gas must be decreased as the gas moves from the gas source into the plasma chamber. The gas must be brought into the chamber in a way that prevents a gas phase discharge, also known as arcing, which would damage the system.

Another design challenge is to place the radio frequency coils that provide power to the plasma as close as possible to the plasma to efficiently transfer power. Maintaining the coils at the same high potential as the plasma, however, would typically require maintaining the power supply for the coil at the high plasma potential, which would excessively complicate the power supply design and greatly increase the cost. Inductively-coupled plasma ion sources may use a split Faraday shield to reduce capacitive coupling between the coil and the plasma. The split Faraday shield must be located between the plasma and the coils and is typically well grounded. When the grounded Faraday shield is located close to the dielectric plasma container, the large electric field caused by the rapid change in potential would likely cause a gas-phase discharge if any air or other low dielectric constant gas is trapped between the Faraday shield and the dielectric plasma chamber, which discharge could damage the source.

Also, the energy applied to the plasma chamber generates heat. While a compact plasma source is desirable for beam formation, the more compact and powerful the plasma source, the hotter the source would become and therefore the greater the need to efficiently dissipate the heat. The high voltage can also make cooling difficult, which can limit the density of the plasma used. These conflicting requirements make the design of an ICP source very challenging.

SUMMARY OF THE INVENTION

An object of the invention is to provide an improved plasma source and an improved charged particle system having a plasma charged particle beam source.

This invention provides high voltage (HV) isolation and cooling of the inductively-coupled plasma source for a charged particle beam system. In one preferred embodiment, the plasma source is surrounded by a Faraday shield substantially encapsulated in a solid dielectric media that prevents gaseous high voltage breakdown at the surface of the shield. In another embodiment, the plasma source is surrounded at least in part by a static fluid that provides HV isolation. The term "static fluid" as used herein means a fluid that is not actively pumped.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Designing a plasma source typically requires many tradeoffs to meet conflicting design requirements. Embodiments of the invention can provide excellent coupling between the RF coil and the plasma, efficient cooling of the plasma chamber, excellent capacitive screening, and high voltage isolation of the plasma source all of which can produce an inductively-coupled plasma that is dense, quiescent, and at high potential.

In some embodiments, expelling air from regions with strong electric fields and filling those volumes with a liquid or other high dielectric constant fluid provides a system designer the opportunity to make design choices with regard to the source configuration that would be otherwise unavailable.

The description below describes a plasma source for a focused ion beam system, but a plasma source of the present invention can be used for an electron beam system, or other system. As used herein, a "fluid" can comprise a liquid or a gas.

Figure 1:
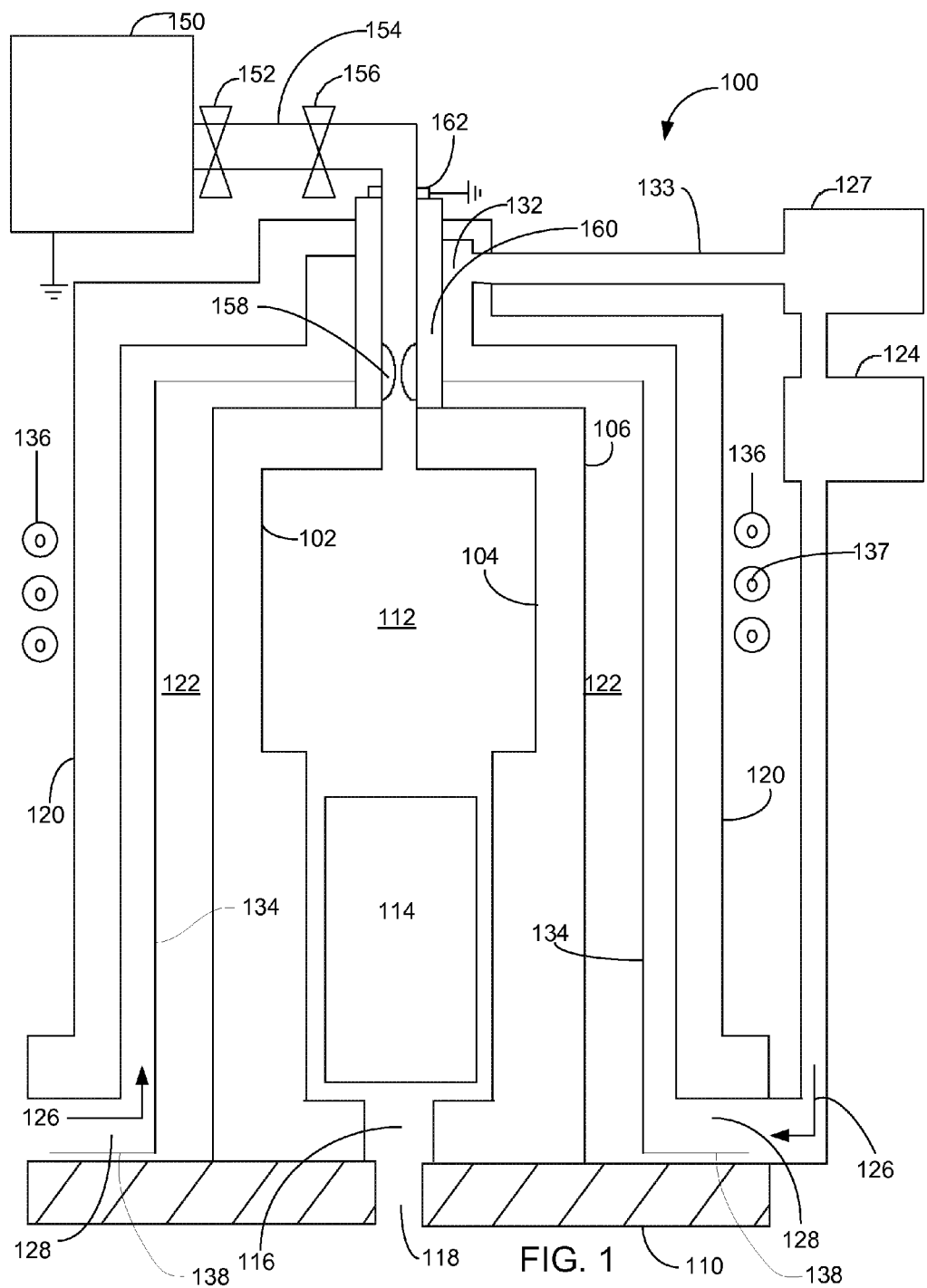
FIG. 1 shows a longitudinal cross-sectional schematic view of a plasma source that uses a Faraday shield for reduced coupling and an insulating fluid for high voltage isolation and cooling.

FIG. 1 shows a stylized longitudinal cross-sectional view of a plasma source 100. The plasma source 100 includes a dielectric plasma chamber 102 having an interior wall 104 and an exterior wall 106. Plasma chamber 102 rests on a conductive base plate 110. Plasma 112 is maintained within the plasma chamber 102. Extraction optics 114 extract charged particles, ion or electrons depending on the application, from plasma 112 through an opening 116 in plasma chamber 102 and opening 118 in base plate 110. A dielectric outer shell 120, preferably of ceramic or plastic material that transmits radio frequency energy with minimal loss, is concentric with plasma chamber 102 and defines a space 122 between outer shell 120 and plasma chamber outer wall 106. A split Faraday shield 134 is located in space 122 and is typically concentric with the plasma chamber 102. A pump 124 pumps a cooling fluid 126 from a reservoir/chiller 127 to space 122 through cooling fluid inlets 128 and exit through exit 132, cooling plasma chamber 102 by thermal transfer from outer wall 106.

The split Faraday shield 134 is typically fixed to ground potential and therefore the electrical potential drops rapidly between the plasma region and the split Faraday shield, thus materials between the plasma region and the split Faraday shield must have sufficiently large dielectric strength to resist arcing. The cooling fluid can be chosen to have a sufficiently high dielectric constant compared to the material of ceramic housing 102 so that the voltage drop across the fluid is sufficiently low to prevent dielectric breakdown at the operating voltage. A liquid coolant is chosen to be free of gaseous bubbles or other impurities which could present the opportunity for field enhancement and gaseous electric discharge. The cooling fluid can also be chosen to be slightly conductive in which case the fluid volume will be substantially free of electric fields and substantially all of the voltage drop will take place in the plasma chamber 102. The cooling fluid should also have sufficient heat capacity to prevent the plasma chamber 102 from overheating without requiring a large fluid flow that requires a large pump that would consume excessive power. The plasma chamber outer wall 106 is typically maintained at a temperature of less than about 50° C.

The fluid preferably comprises a liquid, such as water or Fluorinert™ FC-40, an electrically insulating, stable fluorocarbon-based fluid sold commercially by 3M Company, St. Paul, Minn. Other electrically insulating fluids, such as mineral oil, may be used. Water, such as distilled water or tap water, may be used. An insulating gas, such as sulfur hexafluoride, may also be used. A cooling pump typically pumps the cooling liquid at a rate of between 10 gal/hour and 50 gal/hour from reservoir/chiller 127. Fluid 126 returns from exit 132 to chiller/reservoir 127 via a return conduit 133. Alternately, the cooling fluid can be static liquid that is not mechanically pumped, allowing for significant power savings. Water at room temperature has a dielectric constant of about 80, whereas the ceramic material of the plasma chamber has a dielectric constant of about 9, which results in most of the voltage drop occurring in the ceramic. A preferred insulating fluid has a dielectric constant preferably greater than that of the dielectric material of which the plasma chamber is made. In some embodiments, the insulating fluid has a dielectric constant greater than 5, more preferably greater than 10, even more preferably greater than 20, and most preferably greater than or equal to about 40.

In a typical embodiment, reservoir/chiller 127 cools the cooling fluid to about 20° C. before the fluid is recirculated by pump 124. The cooling fluid partly surrounds the plasma chamber and the coolant flows longitudinally along the plasma chamber from bottom to top. For clarity, FIG. 1 shows cooling fluid entering space 122 on two sides at the bottom of plasma chamber 102 and exiting space 122 one on side at the top of chamber 102. Skilled persons will understand that suitable inlets, outlets, and baffles may be used to ensure an even fluid flow around all sides of the plasma chamber 102.

A Faraday shield 134 passes the radio frequency energy from RF coils 136 to energize the plasma while reducing the capacitive coupling between radio frequency coils 136 and plasma 112. In some embodiments, the Faraday shield 134 is protected from corrosion and physical damage by being substantially encapsulated in a solid dielectric media, such as ceramic, glass, resin, or polymer, to eliminate unwanted fluid in contact with the Faraday shield and to eliminate high voltage discharge. RF coils 136 may be hollow and cooled by flow of a fluid coolant through the internal passages 137 in the coils. The plasma chamber coolant system may also pump fluid coolant through the coils, or the coils can have an independent cooling system.

Faraday shield 134 can be positioned such that cooling fluid 126 flows on both sides of the shield 134. In some embodiments, the shield can be positioned against the plasma chamber outer wall 106 or onto the inside wall of shell 120. For example, the shield can comprise a metallic layer painted or otherwise deposited on outer plasma chamber wall 106 or inside shell wall 120. Faraday shield 134 is electrically grounded. In one embodiment, shield 134 comprises a slotted metal cylinder that is grounded by trapping a tab 138 of the Faraday shield between a portion of outer shell 120 and base plate 110, thereby ensuring a solid ground contact.

The gas from which the plasma is produced must be brought from ground potential to the plasma potential along the path between the tank 150 and the plasma. In a preferred embodiment, most of the voltage change occurs where the gas pressure is relatively high and resistant to arcing.

Gas is provided to plasma chamber 102 from a gas source, such as a tank 150. Tank 150 is typically maintained at ground potential and contains the gas at a high pressure. A regulator 152 reduces the pressure of the gas leaving the tank entering a conduit 154. An optional adjustable valve 156 further reduces the pressure in the gas line or closes the conduit completely when the source is not in use. A flow restrictor, such as a capillary 158, further reduces the gas pressure before the gas reaches plasma chamber 106. Restrictor 158 provides a desired gas conductance between the gas line and the interior of plasma chamber 102. Restrictor 158 is preferably in electrical contact with plasma 112 and so is at the plasma potential. In other embodiments, the flow restriction can have an electrical bias applied from a voltage source other than the plasma. An insulating shield 160 surrounds capillary 158 and a grounded metallic collar 162 at the end of insulating shield 160 ensures that the electrical potential of the gas is zero at that position. Thus, the entire electrical potential change from ground to the plasma voltage occurs within insulating shield 160 in which the gas is at a relatively high pressure and therefore resistant to arcing.

In one example embodiment without a valve 156, regulator 152 reduces the pressure of the gas leaving the supply tank from 150 psig to 5 psig. The gas pressure remains at 5 psig until the gas reaches capillary 158, and which point the gas pressure drops to the plasma chamber pressure of, for example, 0.1 Ton. Insulating shield 160 preferably has sufficient length to keep the field sufficiently low to prevent a damaging discharge. Insulating shield 160 is typically about at least about 5 mm long, and more typically between about 30 mm and 60 mm. For example, if the plasma is maintained at 30 kV, the electric field within a 10 mm shield is about 3 kV/mm, which is sufficiently low to prevent a sustained discharged in most applications. Skilled persons will understand that the local electric field will be a function of the geometry and that initial low current discharges may occur to reach a static charge equilibrium within insulating shield 160. In some embodiments, valve 156 may reduce the gas pressure further before the gas reaches the final restrictor before the plasma. Instead of a capillary, the flow restrictor could be a valve, such as a leak valve. Any type of gas source could be used. For example, the gas source may comprise a liquid or solid material that is heated to produce gas at a sufficient rate to supply the plasma. The different output pressures of the different gas sources may require different components to reduce the pressure to that required in the plasma chamber.

Figure 2:
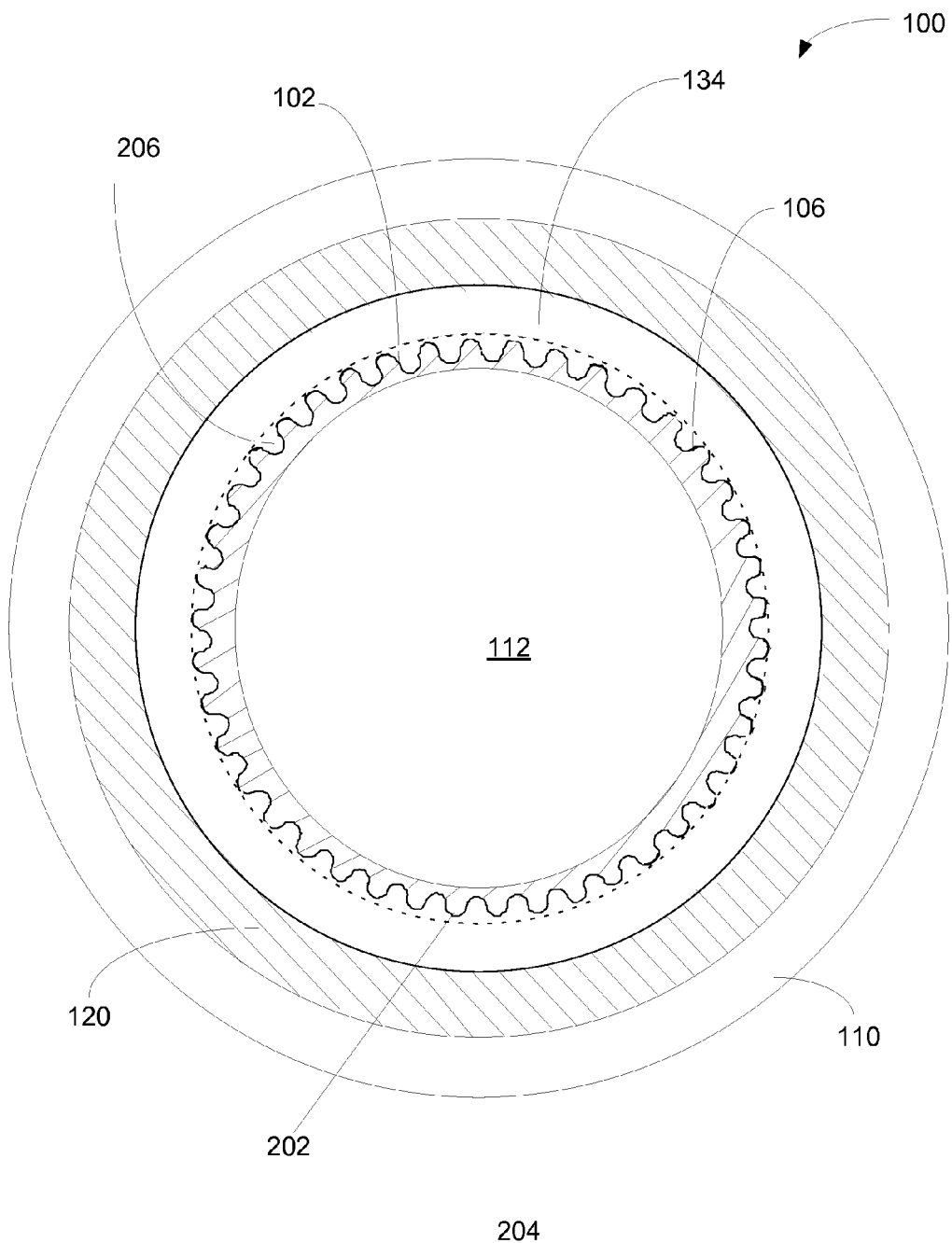
FIG. 2 shows a transverse cross-sectional schematic view of the plasma source of FIG. 1.

FIG. 2 shows a transverse cross-sectional view of plasma source 100 in FIG. 1. FIG. 2 shows that the outer wall 106 of plasma chamber 102 is corrugated, that is, it is composed of a series of ridges 202 and valleys 204. The Faraday shield 134 is positioned against the ridges 202, defining passages 206 for the cooling fluid to flow between the valleys 204 and the shield 134. In the embodiment shown in FIG. 2, the Faraday shield 134 comprises a metal sleeve that slips over plasma chamber outer wall 106. A portion of the metal sleeve is then bent outward at the bottom to form grounding tab 138 (FIG. 1), which is trapped between plasma chamber 102 and ground plate 110. Cooling fluid 126 flows through the space 122 which is bounded by the plasma chamber outer wall 106 and the shell 120. The Faraday shield is "split", that is, there are longitudinal slots in the shield, which allow for inductive coupling between the RF antenna and the plasma 112. In an alternative embodiment, the outer wall 106 may be smooth and the Faraday shield formed with corrugations. Alternatively, neither the wall 106 nor the faraday shield may be corrugated.

Figure 3:
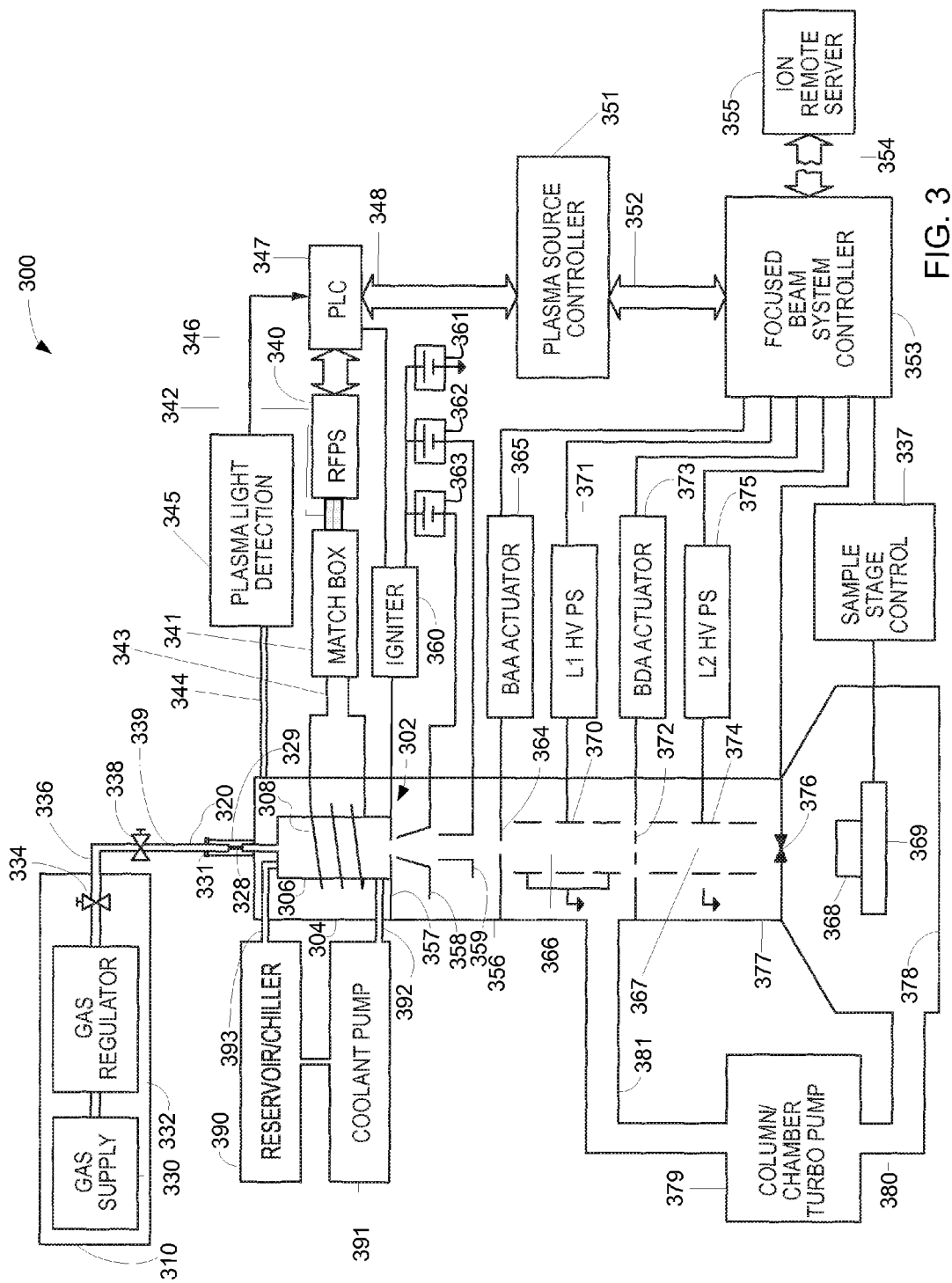
FIG. 3 shows charged particle beam system that uses a plasma source which uses an insulating fluid for cooling and high voltage isolation.

FIG. 3 shows a charged particle beam that uses the plasma source of FIG. 1. At the top of the ion column, an inductively-coupled plasma (ICP) ion source 302 is mounted, comprising an electromagnetic enclosure 304, a source chamber 306, and an induction coil 308, which includes one or more windings of a conductive material. In the embodiment shown in FIG. 3, a coolant reservoir and chiller 390 provides coolant to a pump 391, which provides coolant by conduit 392 to a coolant region around source chamber 306. The coolant then flows back to coolant reservoir and chiller 390 through a return conduit 393. In an alternative embodiment, the coolant region around the source chamber 306 contains a static liquid for high voltage isolation. In such embodiments. reservoir/chiller 390 and coolant pump 391 can be eliminated or can be used to circulate a cooling fluid that does not enter a high voltage region. In yet another embodiment, liquid in the plasma source 302 is cooled by one or more heat pipes, as described in more detail below.

An RF power supply 340 is connected to a match box 341 by an RF coaxial cable 342. The match box 341 is connected to the induction coil 308 by coil leg extentions 343. The induction coil 308 is mounted coaxially with the source chamber 306. To reduce capacitive coupling between the induction coil 308 and the plasma generated within the source chamber 306, a split Faraday shield (not shown) may optionally be mounted coaxially with the source chamber 306 and inside the induction coil 308. When a split Faraday shield is used in the ICP ion source 302, the high voltage (typically several hundred to a few thousand volts) across the induction coil 308 will have minimal effect on the energies of the ions extracted from the bottom of the ICP ion source 302 into the ion column. This will result in smaller beam energy spreads, reducing the chromatic aberration in the focused charged particle beam at or near the substrate surface.

The presence of a plasma within the source chamber 306 may be detected using the light emitted by the plasma and collected by the source-facing end of optic fiber 344, and transmitted through optic fiber 344 to a plasma light detection unit 345. An electrical signal generated by the plasma light detection unit 345 is conducted through cable 346 to a programmable logic controller (PLC) 347. The plasma on/off signal generated by the plasma light detection unit 345 then passes from the PLC 347 through cable or data bus 348 to the plasma source controller 351 executing plasma source control software. Signals from the plasma source controller 351 may then pass through cable or data bus 352 to the focused ion beam (FIB) system controller 353. The FIB system controller 353 may communicate via the Internet 354 to a remote server 355. These details of the interconnections of the various components of the FIB system control are for exemplary purposes only. Other control configurations are possible as is familiar to those skilled in the art.

Gas is provided to the source chamber 306 by inlet gas line 320 which leads to inlet restrictor 328, which leads to the interior of the source chamber 306. Restrictor 328 is maintained at an electrical potential closer to the potential of the plasma in chamber 306 than to the potential of the gas source 310 and regulator 332 so that the voltage drop occurs primarily across gas of higher pressure. Insulating shield 329 insulates the gas line upstream of restrictor 328 and is terminated with a grounded collar 331.

A gas supply system 310 for the ICP source comprises a gas supply 330, a high purity gas regulator 332, and a needle (regulating) valve 334. The gas supply 330 may comprise a standard gas bottle with one or more stages of flow regulation, as would be the case for helium, oxygen, xenon or argon feed gases, for example. Alternatively, for gases derived from compounds which are solid or liquid at room temperature, gas supply 330 may comprise a heated reservoir. Other types of gas supplies 330 are also possible. The particular choice of gas supply 330 configuration is a function of the type of gas to be supplied to the ICP source. Gas from supply 330 passes through high purity gas regulator 332, which may comprise one or more stages of purification and pressure reduction. The purified gas emerging from high purity gas regulator 332 passes through an optional needle valve 334. Gas emerging from optional needle valve 334 passes through a hose 336 to an optional second needle valve 338, mounted in close proximity to the ICP source. Gases emerging from needle valve 338 pass through inlet gas line 320, which connects through restriction 328 to the top of the source chamber 306.

At the bottom of the ICP source 302, a source electrode 357 serves as part of the ion beam extraction optics, working in conjunction with the extractor electrode 358 and the condenser 359. A plasma igniter 360 is connected to a source electrode (not shown), enabling the starting of the plasma in the source enclosure 306. Other known means of igniting the plasma can also be used. Details of the operation of the ICP source are provided in U.S. Pat. No. 7,241,361, issued Jul. 10, 2007, incorporated by reference herein. The source electrode 357 is biased through the igniter 360 to a high voltage by beam voltage power supply (PS) 361. The voltage on the source electrode 357 determines potential of the plasma and therefore the energy of the charged particles reaching the substrate surface in the case of singly-ionized atomic or molecular ion species or electrons. Doubly-ionized ion species will have twice the kinetic energy. The extractor electrode 358 is biased by extractor power supply 363, while the condenser 359 is biased by condenser power supply 362. The combined operation of the source electrode 357, the extractor 358, and the condenser 359 serves to extract and focus ions emerging from the ICP source 302 into a beam which passes to the beam acceptance aperture 364. The beam acceptance aperture 364 is mechanically positioned within the ion column by the beam acceptance aperture actuator 365, under control of the FIB system controller 353. Typical voltage settings may be roughly +30 kV for power supply 361, roughly 15 kV for power supply 362 and roughly 15 kV for power supply 363.

The ion column illustrated in FIG. 3 shows two electrostatic einzel lenses 366 and 367, used to form a highly demagnified (roughly 1/125×) image of the virtual source in the ICP source 302 at or near the surface of substrate 368, mounted on stage 369 controlled by a sample stage controller 337. The first einzel lens, 366, referred to as "lens 1" or "L1," is located directly below the beam acceptance aperture 364 and comprises three electrodes with the first and third electrodes typically being grounded (at 0 V), while the voltage of the center electrode 370 is controlled by lens 1 (L1) power supply (PS) 371. The lens 1 power supply 371 is controlled by the FIB system controller 353.

Between the first einzel lens 366 and the second einzel lens 367 in the ion column, a beam defining aperture assembly 372 is mounted, comprising one or more beam defining apertures (three apertures are shown in FIG. 1). Typically, the beam defining aperture assembly 372 would comprise a number of circular apertures with differing diameter openings, where any one of which could be positioned on the optical axis to enable control of the beam current and half-angle at the substrate surface. Alternatively, two or more of the apertures in the beam defining aperture assembly 372 may be the same, thereby providing redundancy to enable the time between aperture maintenance cycles to be extended. By controlling the beam half-angle, together with corresponding adjustments of the lenses, the beam current and diameter of the focused ion beam at or near the substrate surface may be selected, based on the spatial resolution requirements of the milling or imaging operations to be performed. The particular aperture to be used (and thus the beam half-angle at the substrate) is determined by mechanical positioning of the desired aperture in the beam defining aperture assembly 372 on the optical axis of the column by means of the beam defining aperture (BDA) actuator 373, controlled by the FIB system controller 950.

Beneath the beam defining aperture assembly 372, the second einzel lens 367, referred to as "lens 2" or "L2," is shown. The first and third electrodes are typically grounded (0 V), while the voltage of the center electrode 374 is controlled by lens 2 (L2) power supply (PS) 375. The lens 2 power supply 375 is controlled by the FIB system controller 353. A column/chamber isolation valve 376 is positioned somewhere between the source 302 and the sample chamber 378. Isolation valve 376 enables the vacuum in the ion column vacuum chamber 377 to be maintained at high levels, even if the vacuum level in the sample chamber 378 is adversely affected by sample outgassing, during sample introduction and removal, or for some other reason. A source/chamber turbopump 379 is configured to pump the sample chamber 378 through a pumping line 380. Turbopump 379 also pumps the ion column enclosure 377 through pumping line 381.

The details of the FIB system illustrated in FIG. 3 are for exemplary purposes only—many other FIB system configurations are capable of implementing a multiple mode embodiment of the present invention for milling and imaging. For example, the ion column illustrated in FIG. 3 shows two electrostatic einzel lenses. The ion column may alternatively be implemented using a single electrostatic einzel lens, or more than two electrostatic lenses. Other embodiments might include magnetic lenses or combinations of two or more electrostatic or magnetic quadrupoles in strong-focusing configurations. For the purposes of this embodiment of the present invention, it is preferred that the ion column forms a highly demagnified image of the virtual source (in the ICP source 302) at or near the surface of the substrate 368. Details of these possible demagnification methods are familiar to those skilled in the art.

Figure 4:
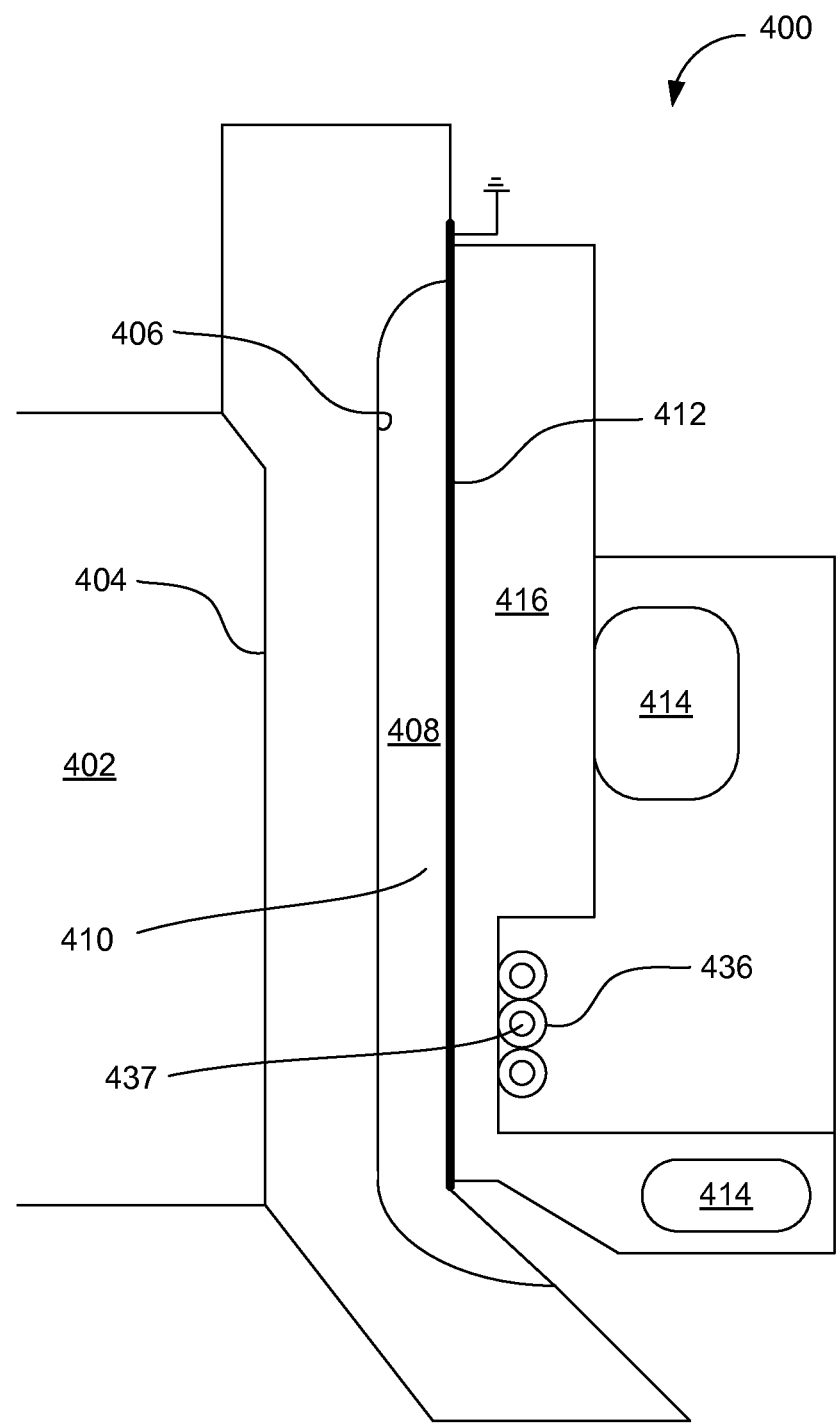
FIG. 4 shows a longitudinal half-sectional schematic view of a plasma source which uses a static fluid for high voltage isolation and active cooling elements.

FIG. 4 shows a half-sectional view of another embodiment of a plasma source 400 that includes a dielectric plasma chamber 402 having an inner wall 404 and an outer wall 406. FIG. 4 shows a static fluid 408 positioned in a cavity 410 between the antenna coils 436 and the outer wall 406 of the plasma chamber and a shell 416. Static fluid may comprise a liquid, such as Fluorinert, oil, or distilled water, or gas, such as sulfur hexafluoride. A split Faraday shield 412 is also positioned between shell 416 and outer wall 406. Faraday shield 412 can be positioned against shell 416 as shown, against outer wall 406, or away from both walls and immersed in the static fluid 408. When positioned between a grounded split Faraday shield 412 and the outer wall 406, fluid 408 provides part of the high voltage isolation of the plasma chamber. Static fluid 408 is preferably not circulated outside of the source 400 by an external pump, although static fluid 408 may move internally by convection within. One or more optional cooling devices 414 assist in cooling the plasma chamber 402. Cooling devices 414 may comprise cooling loops that encircle the plasma chamber and through which a fluid circulates. Because cooling devices 414 are positioned outside of the Faraday shield, which is at ground potential, these devices do not perform any voltage isolation and hence any type of cooling fluid may be used in cooling devices 414. Alternatively, cooling devices 414 may comprise one or more thermoelectric coolers, such as Peltier effect coolers. The RF coils 436 may be hollow and cooled by flow of a coolant through the internal passages 437 in the coils.

Figure 5:
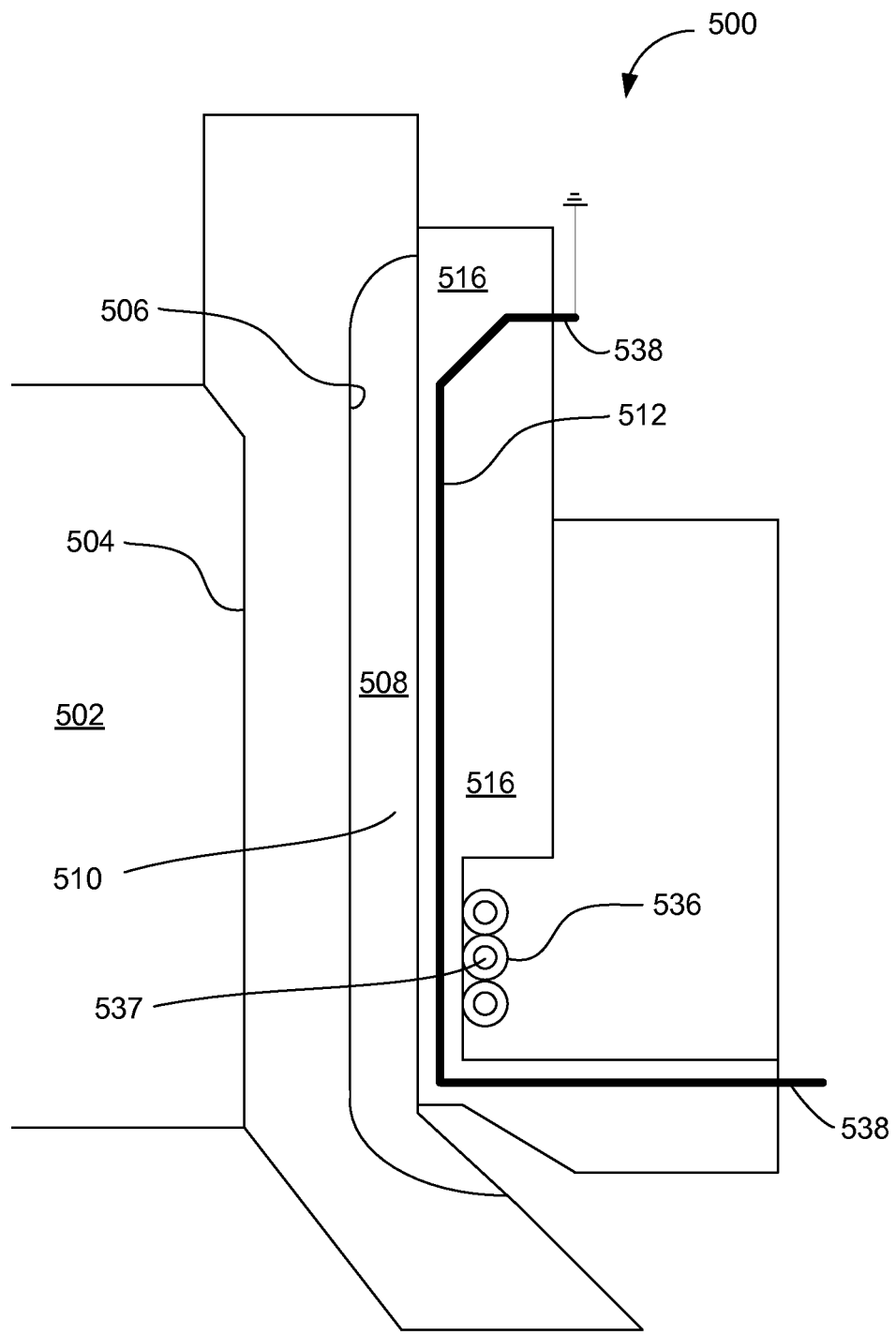
FIG. 5 shows a longitudinal half-sectional schematic view of a plasma source that uses a Faraday shield substantially encapsulated in a solid dielectric media for improved electrical isolation and reduced RF coupling.

FIG. 5 shows a half-sectional view of a plasma source 500 of another embodiment of the invention. FIG. 5 shows the Faraday shield 512 substantially encapsulated in a solid dielectric media 516, which is positioned between the RF coils 536 and the plasma chamber outer wall 506. Solid dielectric media 516 can comprise, for example, a ceramic material such as alumina or quartz, a resin, or an epoxy encapsulant such as Stycast W-19 or Stycast 2762, sold commercially by Emerson & Cumming Specialty Polymers, Billerica, Mass. An optional gap between the dielectric media 516 and outer wall 506 defines a fluid cavity 510, which can be filled with a fluid, such as Fluorinert, distilled water, oil (for example mineral oil), or sulfur hexafluoride. Non-encapsulated portions 538 of the Faraday shield 512 are available to form grounding connections. In some embodiments, fluid 508 is pumped through the fluid cavity 510 and then through a cooler, using a system similar to the system shown in FIG. 1. In other embodiments, fluid 508 is not pumped outside the source and remains within fluid cavity 510. The RF coils 536 may be hollow and cooled by flow of a coolant through the internal passages 537 in the coils.

In some embodiments, dielectric media 516 can be positioned against outer wall 506 without an intervening fluid. To avoid an air gap in such embodiments, dielectric media 516 should fit tightly against outer wall 506. Air gaps can also be avoided by providing a flowable material to fill displace any air between outer wall 506 and dielectric media 506. The flowable media can be, for example, a high dielectric constant grease or gel. The flowable material can remain liquid or may solidify after positioning the dielectric media relative to the plasma chamber. In some embodiments, the dielectric media can comprise a flowable medium that hardens or remains liquid. For example, a flowable, hardenable material may be applied to outer wall 506 and/or to Faraday shield 512 before Faraday shield 512 is slipped over outer wall 506, so that the Faraday shield is positioned around outer wall 506, with the flowable medium filling any gap between Faraday shield 512 and the outer wall 506. The flowable medium may also coat the Faraday shield on the side opposite to outer wall 506, thereby preventing contact between any cooling fluid and the Faraday shield. In some embodiments, the Faraday shield can be molded into the wall of plasma chamber 502.

Figure 6A:
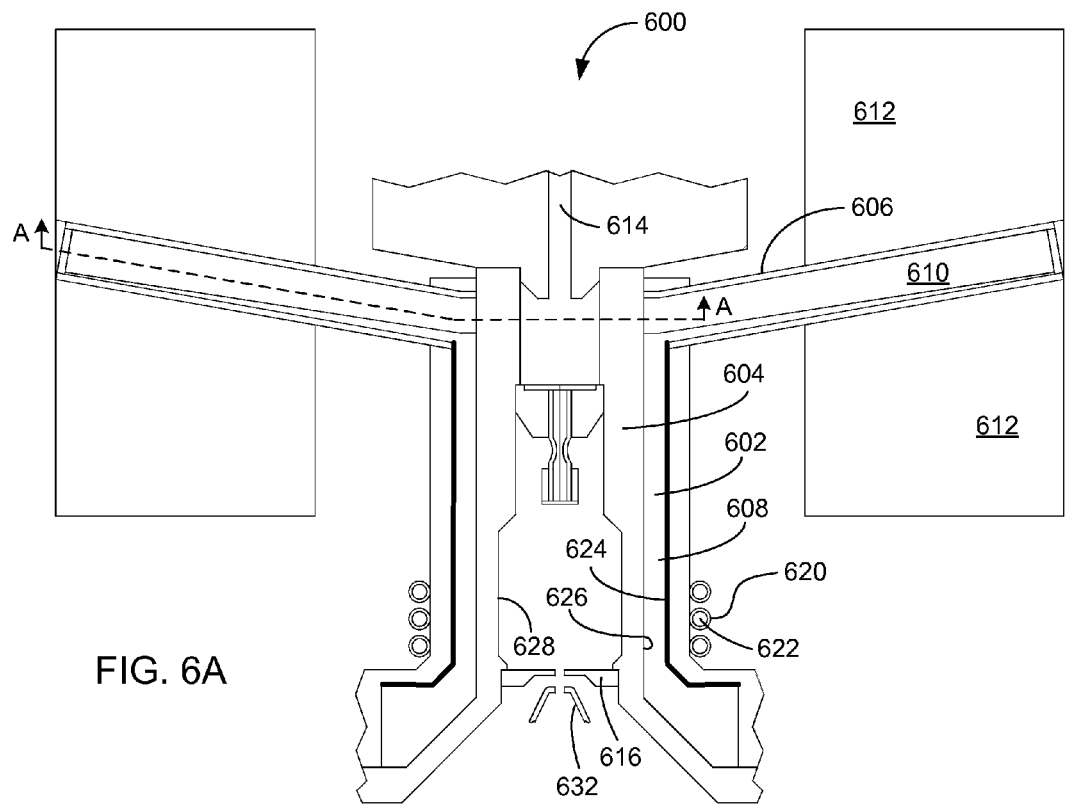
FIG. 6A shows a cross-sectional schematic view of a plasma source with integrated heat pipe cooling.

FIG. 6A through FIG. 6D show multiple views of another embodiment of a plasma source 600 with integrated heat pipe cooling. The plasma source 600 includes a dielectric plasma chamber 604 having an interior wall 628 and an exterior wall 626. FIG. 6A shows a cross-sectional schematic view of the embodiment of plasma source 600 which incorporates a preferred heat pipe cooling device. See cross-section cut line B-B of FIG. 6C. A "heat pipe" is a heat-transfer device that utilizes phase transition to efficiently transfer heat. In this embodiment, a static fluid coolant 602 surrounds the plasma chamber 604 having one or more heat pipes 606 integrated into the upper portion of the coolant jacket 608. The coolant 602 is evaporated by heat from the plasma chamber 604 creating coolant vapor 610 which rises toward the cooling fins 612. Heat from the coolant vapor 610 is dissipated through the cooling fins 612 and transferred into the surrounding air causing the coolant vapor to cool. As the coolant vapor cools, it condenses and flows back into coolant jacket 608. Alternately, the liquid inside of the heat pipe 606 may be separate from the liquid in the cooling jacket 608, having the evaporation-condensation cycle self-contained within the heat pipe.

Preferably, multiple heat pipes are integrated into the upper portion of the coolant jacket 608 to provide increased heat dissipation capability. The coolant 602 is positioned in the coolant jacket 608 which is positioned between the antenna coils 620 and the outer wall 626 of the plasma chamber, preferably positioned between a split Faraday shield 624 and the outer wall 626. Alternately, the split Faraday shield may be substantially encapsulated in a solid dielectric media. When positioned between a grounded split Faraday shield 624 and the outer wall 626, liquid 602 provides part of the high voltage isolation of the plasma chamber. Static liquid coolant 602 is not circulated outside of the source 600 by an external pump, although static liquid coolant 602 may move internally by convection and also by the gravity flow of the condensing coolant. In some embodiments, liquid coolant carries heat away from wall 626 by convection and without a phase change, with the hot liquid rising, being cooled, for example, by cooling fin 612, and flowing back into cooling jacket 608. Coolant can flow in contact with outer wall 626, or it can flow in cooling channels outside of outer wall 626. The RF coils 620 may be hollow and cooled by flow of a coolant through the internal passages 622 in the coils. Gas enters the plasma chamber 604 through gas inlet 614, and charged particles are pulled from the plasma chamber 604 by an extractor electrode 632.

Figure 6B:
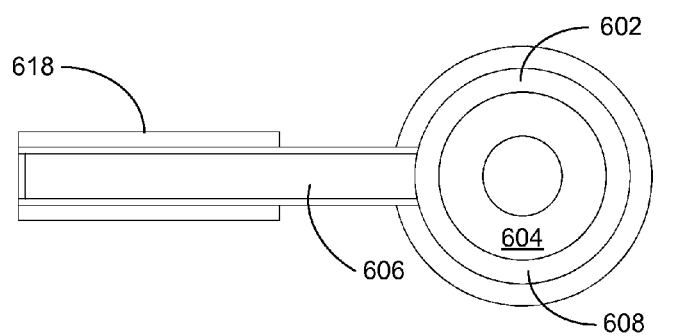
FIG. 6B shows a cross-sectional schematic view of a plasma source with integrated heat pipe cooling, displaying one heat pipe.

FIG. 6B shows a cross-sectional view through cut line A-A of the plasma source 600 in FIG. 6A, illustrating one heat pipe. The source end of the heat pipe 606 is connected to the coolant jacket 608 which surrounds the plasma chamber 604. Static liquid coolant 602 occupies the coolant jacket space. The opposite end of the heat pipe 606 is connected to the cooling fin mount 618. Liquid coolant is referred to as static because it is not actively pumped, although it will be understood that the liquid may move due to thermal gradients in the liquid.

Figure 6C:
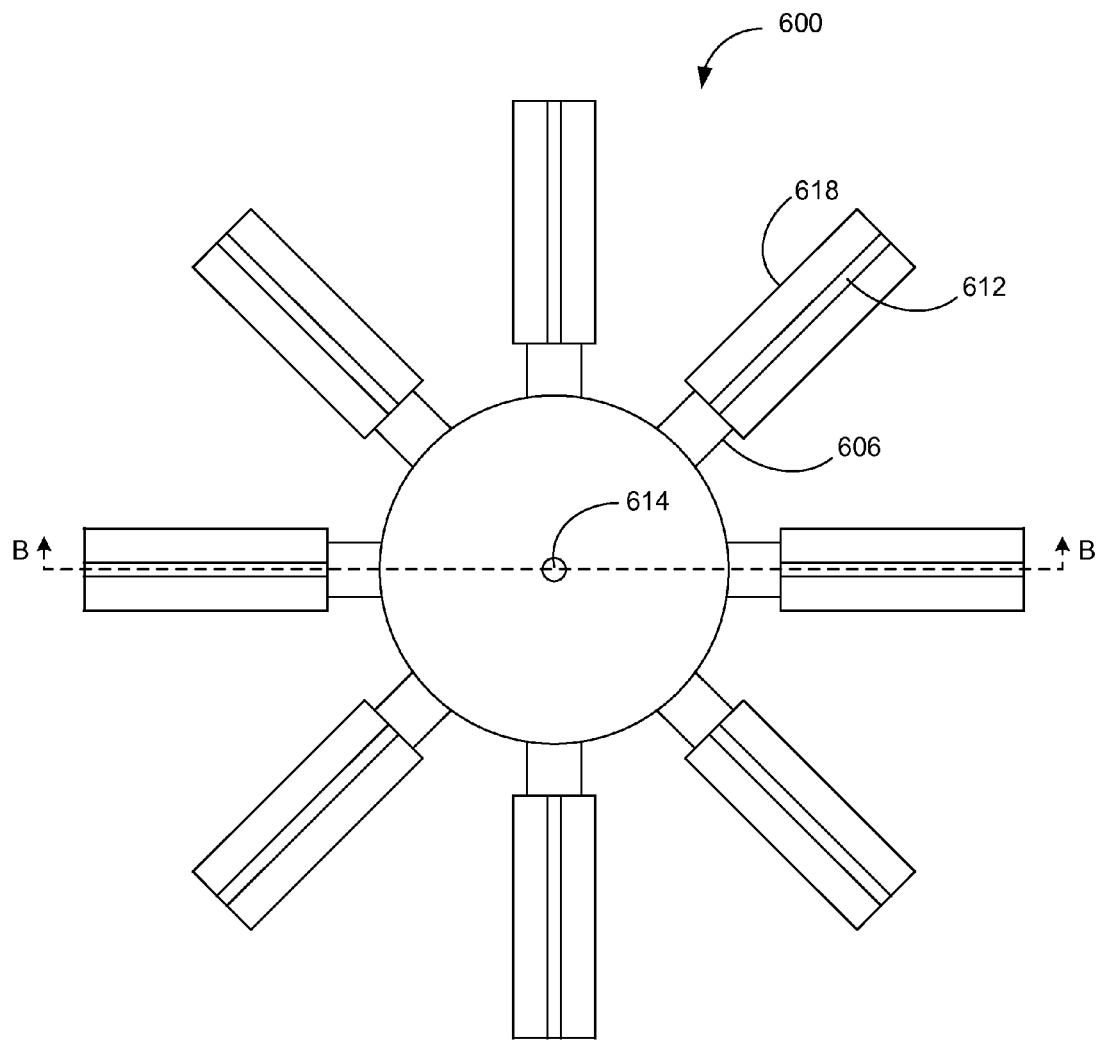
FIG. 6C shows a top view of a plasma source with integrated heat pipe cooling, displaying an example configuration of several heat pipes distributed around the perimeter of the plasma source.

FIG. 6C shows a top view of the plasma source 600 with an example configuration of integrated heat pipes. In this embodiment, eight heat pipes 606 are integrated radially to the plasma source and located near the top of the plasma source. Each heat pipe 606 has a cooling fin mount 618 attached to the outward end of the heat pipe. One or more cooling fins 612 are connected to each cooling fin mount 618.

Figure 6D:
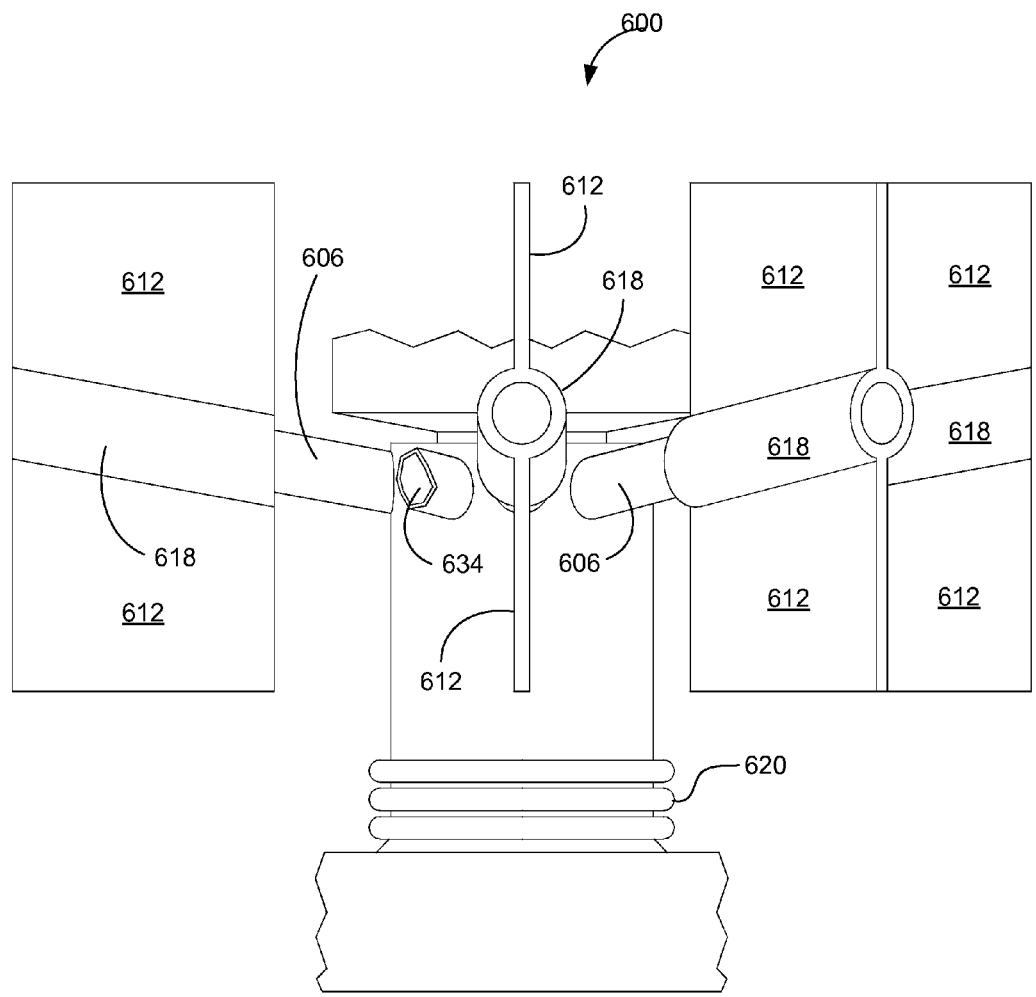
FIG. 6D shows a side view of a plasma source with integrated heat pipe cooling, displaying an example heat pipe configuration.

FIG. 6D shows a side view of the plasma source 600 in FIG. 6C with one of the eight heat pipes, heat pipe 634, cut away to further illustrate the cooling fin and heat pipe arrangement. For clarity, only the foreground heat pipes are depicted in this diagram. Heat pipes 606 are integrated radially to the plasma source and located in the upper portion of the plasma source. Each heat pipe 606 has a cooling fin mount 618 with one or more cooling fins 612 attached.

Figure 7:
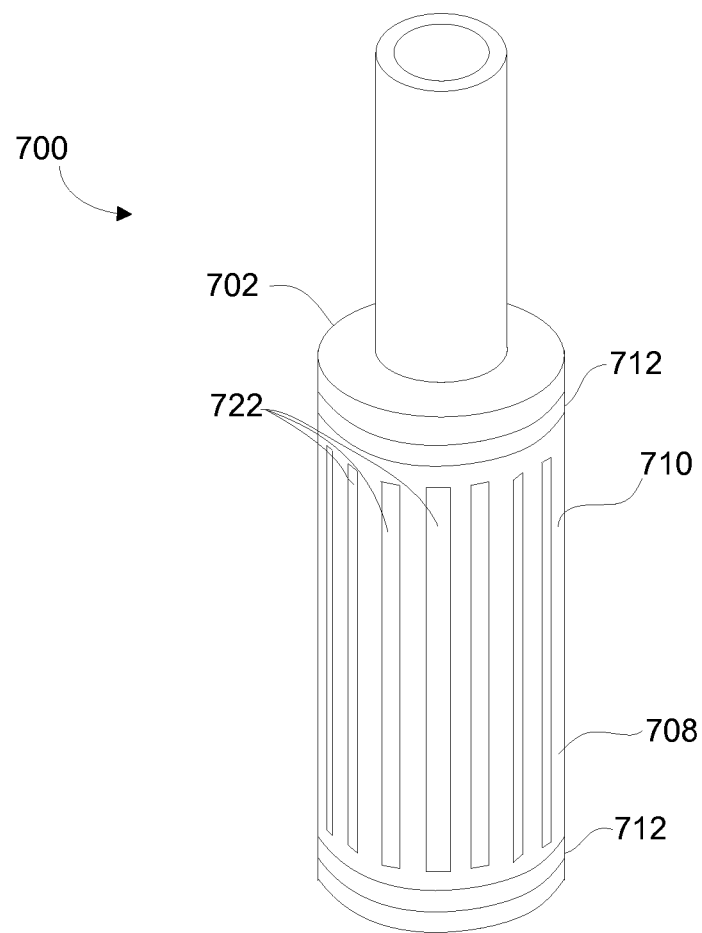
FIG. 7 shows a front view of a plasma source with a plasma chamber bonded to a split Faraday shield surrounded by an encapsulant.

FIG. 7 shows a front view of a portion of a plasma source 700 including a dielectric structure 702 having an interior cavity (not visible) for containing a plasma. That is, the dielectric structure 702 forms the walls of the plasma chamber. A split Faraday shield 708 is positioned such that the shield is in contact with, and preferably intimately bonded to, dielectric structure 702. Preferably, Faraday shield 708 is configured such that there are substantially no voids (that is, empty spaces that could be filled by air, cooling fluid, or any other fluid) between the shield and the dielectric structure 702. The absence of voids around the dielectric structure 702 ensures that no high voltage arc discharge can occur. Substantially no voids means that any voids that are present are sufficiently small to prevent damaging arcing.

The shield 708 can be for example, similar to the shield described in U.S. patent application Ser. No. 13/353,032, which is assigned to the assignee of the present invention. An encapsulant 710 is applied to surround split Faraday shield 708. For illustration, FIG. 7 shows the Faraday shield 708 visible through a translucent encapsulant 710. Split Faraday shield 708 has gaps 722 to reduce eddy currents that drain energy from the RF coils. The encapsulant 710 preferably contacts and adheres to the regions of the dielectric structure 702 in the gaps 722 and, in some embodiments, in other regions that are not covered by shield 708. There are preferably substantially no voids between the encapsulant and the dielectric structure in regions where the encapsulant contacts the dielectric structure. In other words, there are preferably no voids between the encapsulant and the dielectric structure regardless of whether potions of the shield are between the encapsulant and the dielectric structure. A portion of the split-Faraday shield 708, such as regions 712, extends from beneath the encapsulant 710 in order to provide a means of electrical connection to the shield. The extensions may also be, for example, in the form of tabs. Instead of regions of the Faraday shield extending from the encapsulant, an electrical contact could be made through a gap in the encapsulant or a conductor could extend out of the encapsulant from the Faraday shield.

The encapsulant 710 is preferably a thin, leak-proof, dielectric material that adheres to and protects the covered portion of the shield 708 and of the dielectric structure 702. The encapsulant is not electrically conductive so that no eddy currents can be supported within the media. Encapsulant 710 should be thin to increase heat conductance from structure 702. The thickness of a preferred encapsulant is less than 10 mm, more preferably less than 5 mm, and even more preferably less than 3 mm. Encapsulant 710 is preferably highly thermally conductive in order to present the lowest possible thermal barrier so the plasma chamber may be efficiently cooled by different cooling methods, such as the ones described in previous embodiments. Furthermore, the encapsulant 710 is preferably non-porous so that there is no fluid contact with the split-Faraday shield where it is surrounded by the encapsulant 710. Suitable materials for the encapsulant 710 may include, but are not limited to epoxy, enamel, and glass frit.

Using a split-Faraday shield 708 in contact with dielectric structure 702 and configured so that there is no air between the Faraday shield and the dielectric structure, as well as using an encapsulant that protects the shield and allows no air between the encapsulant and the Faraday shield, prevents air and cooling liquid from coming in to the high DC voltage region between the plasma chamber and the Faraday shield, thereby simplifying the design of the system.

Figure 8:
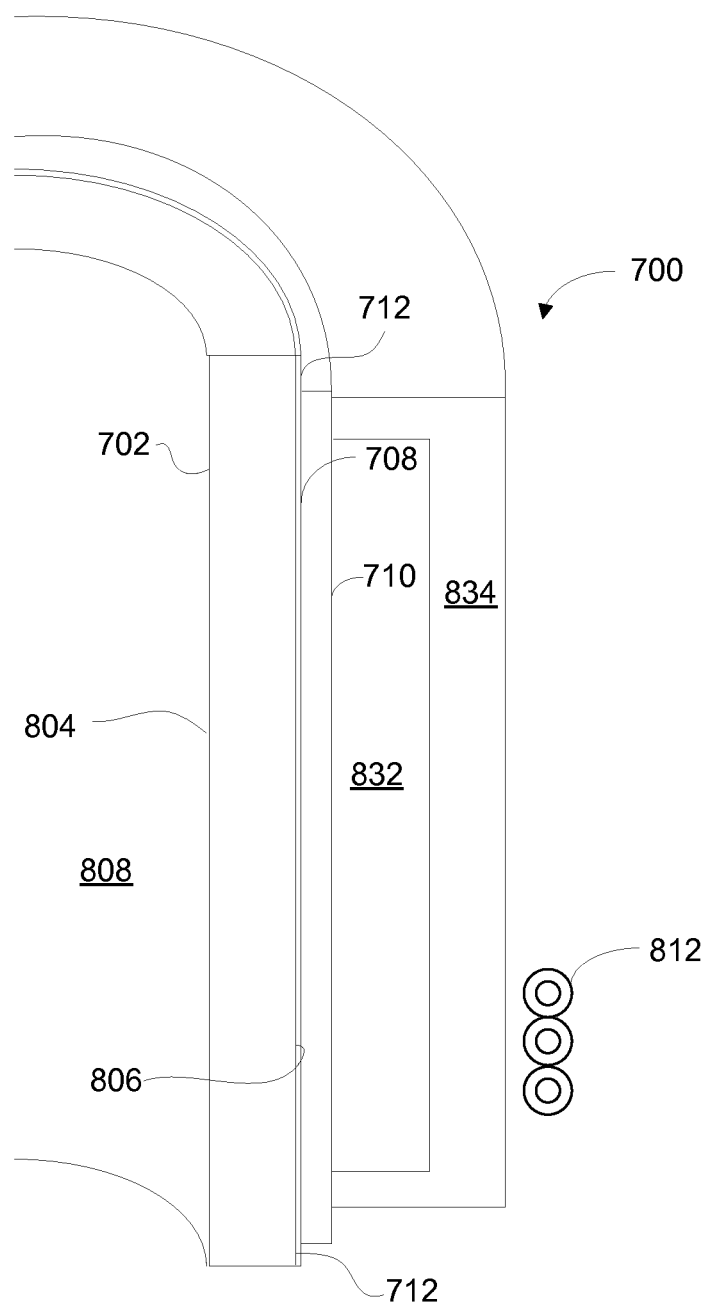
FIG. 8 shows a partial cross section of the plasma source of FIG. 7.

FIG. 8 shows a partial sectional view of the embodiment shown in FIG. 7. The dielectric structure 702 defines an inner wall 804 and an outer wall 806 of a plasma chamber 808. A plasma is maintained within plasma chamber 808. Split Faraday shield 708 is positioned such that it is in contact with outer wall 806. Encapsulant 710 is applied to a portion of outer wall 806 such that the encapsulant is well adhered to the Faraday shield 708 and to the portions of the outer wall 806 that remain exposed by the slits in the split Faraday shield, thereby excluding any air or cooling fluid between the Faraday shield and the outer wall 806. Regions 712 of the split Faraday shield extend from beneath the encapsulant 710, either above the encapsulant, below the encapsulant, or both above and below the encapsulant. Cooling methods, such as the ones described by previous embodiments, may be supplied in the space 832 between the encapsulant 710 and a dielectric outer shell 834, which is preferably made of ceramic or plastic material that transmits radio frequency energy with minimal loss. The RF coils 812 may be hollow and cooled by flow of a coolant through the internal passages in the coils.

Materials and structures described in one embodiment or described as part of the prior art may be used in other embodiments. Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A charged particle beam system, comprising:
    a plasma source having:
        a plasma chamber having a wall composed of a dielectric material, the wall having an interior surface and an exterior surface;
        a conductor coiled at least one time around the plasma chamber;
        a shield composed of an electrically conductive material and substantially surrounded on both sides by a solid dielectric media so that the conductive shield is not contacted by a coolant or by the plasma, the conductive shield positioned between the plasma chamber and the conductor coiled around the plasma chamber; and
        a source electrode for electrically biasing the plasma to a high voltage; and
    one or more focusing lenses for focusing charged particles from the plasma source onto a sample.

2. The charged particle beam system of claim 1 in which the shield is positioned on the exterior surface of the plasma chamber.

3. The charged particle beam system of claim 2 in which there are substantially no voids between the conductive material of the shield and the exterior surface of the plasma chamber.

4. The charged particle beam system of claim 2 in which the shield includes gaps for passing an inductive field to the plasma chamber and in which the dielectric encapsulant contacts the exterior surface of the plasma chamber wall between the gaps in the conductive material.

5. The charged particle beam system of claim 1 in which the dielectric encapsulant comprises an epoxy, enamel, a glass frit, a resin, or a polymer.

6. The charged particle beam system of claim 1 further comprising a fluid contacting at least a portion of the dielectric media.

7. The charged particle beam system of claim 6 in which the fluid is positioned between the dielectric encapsulant and the conductor coiled around the plasma chamber.

8. The charged particle beam system of claim 6 in which the fluid is positioned between the exterior surface of the plasma chamber and the dielectric encapsulant.

9. The charged particle beam system as in claim 6 in which the fluid is not actively pumped.

10. The charged particle beam system of claim 2 in which a non-encapsulated portion of the shield is exposed for making electrical contact.

11. The charged particle beam system of claim 2 in which a material is provided to displace any voids between the exterior surface of the plasma chamber wall and the dielectric media.

12. The charged particle beam system of claim 11 in which the material provided to displace any gaps between the exterior surface of the wall and the dielectric media comprises a liquid or a liquid that subsequently hardens after being applied.

13. The charged particle beam system of claim 1 in which substantially encapsulating the shield comprises surrounding the shield with dielectric media on both sides.

14. The charged particle beam system of claim 1 in which substantially encapsulating the shield comprises providing a barrier between the plasma and the shield.

15. The charged particle beam system of claim 1 in which substantially encapsulating the shield comprises providing a barrier between the plasma and the shield and between a liquid coolant and the shield.

16. A plasma source for a charged particle beam system comprising:
    a plasma chamber having a wall with an interior surface and an exterior surface;
    a conductor for providing radio frequency energy to the plasma chamber;
    a conductive shield, the conductive shield positioned between the conductor and the exterior surface of the plasma chamber; and
    a fluid positioned between the conductive shield and the conductor; and
    a solid dielectric media substantially surrounding the conductive shield on both sides so that the conductive shield is not contacted by the fluid or by the plasma.

17. The plasma source of claim 16 in which the fluid is cooled by a cooling system.

18. The plasma source of claim 16 in which the fluid comprises water or a fluorine compound.

19. The plasma source of claim 16 in which the fluid is positioned between the exterior surface of the plasma chamber and the dielectric media encapsulating the conductive shield.

20. The plasma source of claim 16 in which the conductive shield substantially encapsulated in a dielectric media comprises surrounding the shield with dielectric media on both sides.

21. A method of providing high voltage isolation to a plasma source of a charged particle beam system, comprising:
    providing a plasma chamber;
    providing a conductor coiled at least one time around the plasma chamber;
    providing a conductive shield positioned between the plasma chamber and the conductor;
    substantially surrounding the conductive shield on both sides by a solid dielectric media so that the conductive shield is not contacted by a coolant or by the plasma; and
    providing a source electrode for electrically biasing the plasma to a high voltage.

22. The method of claim 21 further comprising providing a cooling fluid contacting at least a portion of the solid dielectric media.

23. The method of claim 21 in which the cooling fluid is positioned between the plasma chamber and the dielectric media encapsulating the conductive shield.

24. The method of claim 21 in which the cooling fluid is positioned between the dielectric media encapsulating the conductive shield and the conductor coiled around the plasma chamber.

25. The method of claim 21 further comprising pumping the cooling fluid to cool the plasma chamber.

* * * * *